US006637105B1

(12) United States Patent
Watanabe et al.

(10) Patent No.: US 6,637,105 B1
(45) Date of Patent: Oct. 28, 2003

(54) METHOD OF MANUFACTURING A MULTILAYER PRINTED WIRING BOARD

(75) Inventors: Yoshio Watanabe, Kanagawa (JP); Nobuyuki Yasuda, Kanagawa (JP); Hironori Mihono, Kanagawa (JP); Yuji Nishitani, Kanagawa (JP)

(73) Assignee: Sony Corporation, Tokyo (JP)

( * ) Notice: Subject to any disclaimer, the term of this patent is extended or adjusted under 35 U.S.C. 154(b) by 130 days.

(21) Appl. No.: 09/637,859

(22) Filed: Aug. 15, 2000

(30) Foreign Application Priority Data

Aug. 16, 1999 (JP) .......................................... 11-229900

(51) Int. Cl.[7] .......................... H01K 3/10; H05K 3/20; H05K 3/02; H05K 1/09
(52) U.S. Cl. .............................. 29/852; 29/831; 29/846; 174/251
(58) Field of Search ...................... 216/13, 20; 174/262, 174/263, 251, 261; 29/830, 831, 837, 839, 840, 846, 847, 852

(56) References Cited

U.S. PATENT DOCUMENTS

| | | | | |
|---|---|---|---|---|
| 4,720,324 A | * | 1/1988 | Hayward | 156/645 |
| 4,972,050 A | * | 11/1990 | Hammond et al. | 174/251 |
| 5,263,243 A | * | 11/1993 | Taneda et al. | 156/89.18 |
| 5,484,647 A | * | 1/1996 | Nakatani et al. | 361/748 |
| 5,672,226 A | * | 9/1997 | Deardorf | 156/288 |
| 5,786,270 A | * | 7/1998 | Gorrell et al. | 438/612 |
| 5,888,627 A | * | 3/1999 | Nakatani | 174/264 |

FOREIGN PATENT DOCUMENTS

JP 2002-198628 * 5/1999 ............ H05K/1/11

* cited by examiner

Primary Examiner—Carl J. Arbes
Assistant Examiner—Thiem D Phan
(74) Attorney, Agent, or Firm—Rader, Fishman & Grauer PLLC; Ronald P. Kananen, Esq.

(57) ABSTRACT

The invention provides a high-density multilayer printed wiring board and a method for manufacturing a multilayer printed wiring board having high-density wiring that is formed easily. A method for manufacturing a multilayer printed wiring board formed by laminating a plurality of laminates comprises a step for forming a conduction hole on a laminate comprising an insulating board having both sides on which conductive films are formed, a step for electrically connecting between both sides of said laminate through the above-mentioned conduction hole and planarizing the surface, a step for patterning the above-mentioned conductive film desiredly and forming a projection member at a desired position of the above-mentioned conductive film, a step for laminating bonding members having a through hole to which the above-mentioned projection member is inserted, which is served for bonding between the above-mentioned laminates, and the above-mentioned laminates alternately with insertion of the above-mentioned projection member into the above-mentioned throughhole, and a step for press-molding the above-mentioned laminated laminates and bonding members with heating.

13 Claims, 7 Drawing Sheets

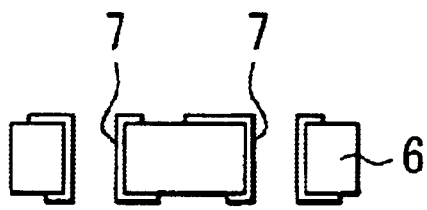
FIG. 9A
PRIOR ART
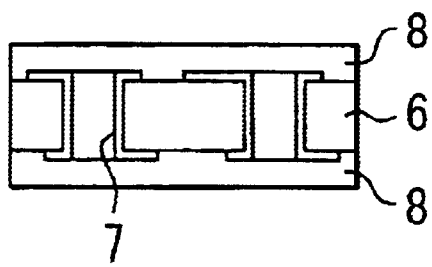
FIG. 9B
PRIOR ART
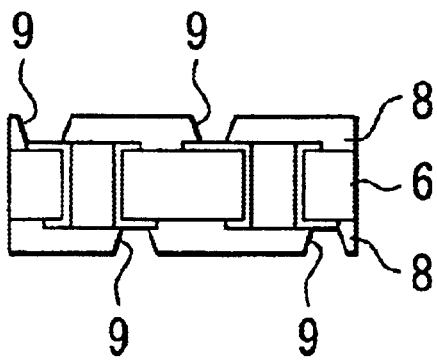
FIG. 9C
PRIOR ART
FIG. 9D
PRIOR ART
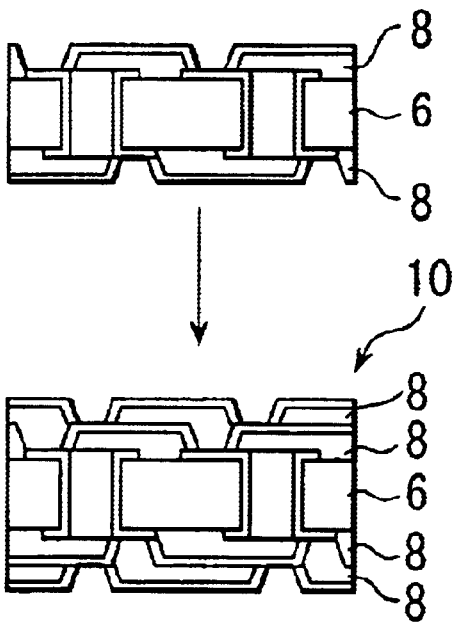
FIG. 9E
PRIOR ART

METHOD OF MANUFACTURING A MULTILAYER PRINTED WIRING BOARD

BACKGROUND OF THE INVENTION

1. Field of the Invention

This invention relates to a modified multilayer printed wiring board and a modified method for manufacturing the multilayer printed wiring board, and more particularly relates to a multilayer printed wiring board having high density wiring and a method for manufacturing the multilayer printed wiring board having high density wiring.

2. Description of the Related Art

FIG. 8A to FIG. 8E show an exemplary process for manufacturing a conventional multilayer printed wiring board, and the process for manufacturing the conventional multilayer printed wiring board will be described herein under with reference to FIG. 8A to FIG. 8E.

At first, as shown in FIG. 8A, copper foils are formed on both sides of an insulating board to form a plurality of laminates 1 that are not conductive between both sides. Subsequently as shown in FIG. 8B, a via hole 1a is formed on each laminate, and the laminate becomes conductive between both sides by, for example, plating on the via hole.

Subsequently as shown in FIG. 8C, a plurality of laminates 1 are laminated by use of a bonding member 2 consisting of prepreg. Then, a through hole 3 that passes through the plurality of laminates 1 is formed as shown in FIG. 8D. To ensure electrical connection between the laminates, for example, copper foils 4 or the like is formed by plating on the surface of the laminates and the through hole 3. Finally, the copper foils on the surfaces of the laminates are patterned desiredly to complete a multilayer printed wiring board 5.

FIG. 9A to FIG. 9E show another conventional process for manufacturing a multilayer printed wiring board, a method for manufacturing a multilayer printed wiring board will be described herein under with reference to FIG. 9A to FIG. 9E. The manufacturing method shown in FIG. 9A to FIG. 9E is a method so-called as build-up method.

At first, as shown in FIG. 9A, through holes 7 are formed on a laminate 6 comprising an insulating board, and the surface of the through holes 7 is plated. Then, insulating layers 8 are formed on both sides of the laminate 6 as shown in FIG. 9B. Subsequently as shown in FIG. 9C, via holes 9 are formed on the insulating layers 8, and the via holes 9 are plated. By repeating the processes shown in FIG. 9B to FIG. 9D, a multilayer printed wiring board 10 shown in FIG. 9D is formed. It is possible to form high density wiring because wirings are intersected each other on the same plane as described hereinabove.

However, the multiplayer printed wiring board and the manufacturing method thereof described hereinabove are involved in the problem as described hereafter.

In the method for manufacturing a multilayer printed wiring board shown in FIG. 8A to FIG. 8E, it is required to form a through hole 3 that passes through all the laminates 1 in order to render arbitrary laminates 1 conductive therebetween. As the result, it is difficult to realize a high density multilayer printed wiring board, and the less freedom of high density wiring of a multilayer printed wiring board 5 is the problem.

Furthermore, in the method for manufacturing a multilayer printed wiring board shown in FIG. 9A to FIG. 9E, it is required to form a plurality of insulating layers 8 and to plate, and such a long manufacturing process results in poor yield and the poor yield is the problem.

Recently, a method for forming a multilayer printed wiring board ($B^2it$™) (Buried Bump Interconnection Technology) in which a projection member is formed with conductive paste and prepreg is penetrated, and a method for forming a multilayer printed wiring board (ALIVH™) (Any Layer IVH Structure Printed Wiring Board) in which a through hole is formed on prepreg and a projection member is inserted into the through hole are presented.

However, the so-called $B^2it$™ is involved in a problem that the thickness of a printed wiring board is restricted because the projection member is formed of conductive paste. In detail, it is required to use a large projection member to render the insulating layer thick and the large projection member is disadvantageous for high density wiring. On the other hand, it is required to render the insulating layer thin if the bump is small.

ALIVH™ is also involved in a problem that the resistance value in the through hole is large because conductive paste connects between layers. Both in $B^2it$™ and ALIVH™, conductive paste that migrates along fibers that form the insulating layer is also a problem.

SUMMARY OF THE INVENTION

The present invention has been accomplished to solve the above-mention problems, and provides a multilayer printed wiring board having high density wiring to be formed easily and a manufacturing method thereof.

According to one aspect of the present invention, the above-mentioned object is achieved by applying a method for manufacturing a multilayer printed wiring board formed by laminating a plurality of laminates comprising a step for forming a conduction hole on a laminate comprising an insulating board having both sides on which conductive films are formed, a step for electrically connecting between both sides of the above-mentioned laminate through the above-mentioned conduction hole and planarizing the surface, a step for patterning the above-mentioned conductive film desiredly and forming a projection member at a desired position of the above-mentioned conductive film, a step for laminating bonding members having a through hole to which the above-mentioned projection member is inserted, which is served for bonding between the above-mentioned laminates, and the above-mentioned laminates alternately with insertion of the above-mentioned projection member into the above-mentioned through hole, and a step for press-molding the above-mentioned laminated laminates and bonding members with heating.

According to the structure of the above aspect, a multilayer printed wiring board is manufactured by applying a process comprising a step for alternately laminating laminates having conductive films in the form of desired pattern on which a projection member is formed and bonding members on which a through hole is formed, and a step for press-heat-molding a plurality of laminates and bonding members that have been laminated alternately. Electrical connection between arbitrary laminates is formed by connecting a projection member consisting of metal to a conductive film.

Laminates are laminated not in one after another fashion, but a laminate and a projection member are laminated previously and heat-press-molded in one step to manufacture a multilayer printed wiring board. Furthermore, laminates to be used for a multilayer printed wiring board are manufactured separately and then laminated. Thereby, only non-defective laminates are used for manufacturing. Because the projection member consists of metal, the length can be adjusted arbitrarily, and the resistance value between laminates is small when the projection member is connected to the conductive film consisting of metal.

According to another aspect of the present invention, the above-mentioned object is achieved by applying a multilayer printed wiring board formed by means of a laminating process comprising a step for forming a conduction hole on a laminate comprising an insulating board having both sides on which conductive films are formed, a step for electrically connecting between both sides of the above-mentioned laminate through the above-mentioned conduction hole and planarizing the surface, a step for patterning the above-mentioned conductive film desiredly and forming a projection member at a desired position of the above-mentioned conductive film, a step for laminating bonding members having a through hole to which the above-mentioned projection member is inserted, which is served for bonding between the above-mentioned laminates, and the above-mentioned laminates alternately with insertion of the above-mentioned projection member into the above-mentioned through hole, and a step for press-molding the above-mentioned laminated laminates and bonding members with heating.

According to the structure of the above aspect, laminates, each of which has a conductive film having a predetermined pattern on which projection members are formed, and bonding members, each of which has through holes, are laminated alternately and a plurality of laminated laminates are subjected to press-heat, molding. A metal projection member is electrically connected to a conductive film to electrically connect between arbitrary laminates. A multiplayer printed wiring board is formed not by laminating laminates one after another but by molding laminates and projection members at a time in the present invention.

Because the projection member consists of metal, the length of the projection member can be adjusted arbitrarily, and the resistance value between laminates is reduced when the conductive film consisting of metal is connected to the projection member. As the result, the freedom of wiring is improved and the high-density wiring is realized by applying the multilayer printed wiring board of the present invention.

BRIEF DESCRIPTION OF THE DRAWINGS

FIG. 9A to FIG. 9E are process diagrams for illustrating an exemplary conventional method for manufacturing a multilayer printed wiring board.

DETAILED DESCRIPTION OF THE PREFERRED EMBODIMENTS

Preferred embodiments of the present invention will be described in detail hereinafter with reference to the attached drawings.

The embodiments described hereinafter involve various technically preferable restrictions because the embodiments are detailed preferred examples of the present invention, but the scope of the present invention is by no means limited by any of these embodiments unless otherwise the present invention is specified to be limited.

FIG. 1A to FIG. 1I and FIG. 2A to FIG. 2E are schematic process diagrams for illustrating a preferred embodiment of a method for manufacturing a multilayer printed wiring board of the present invention, and the method for manufacturing a multilayer printed wiring board will be described with reference to FIG. 1A to FIG. 1I and FIG. 2A to FIG. 2E.

Figure 1A:
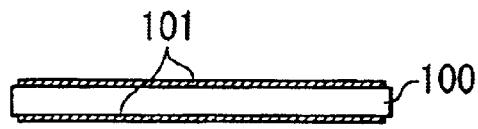
FIG. 1A to FIG. 1I are schematic process diagrams for illustrating a preferred embodiment of a method for manufacturing a multilayer printed wiring board of the present invention.
Figure 1B:
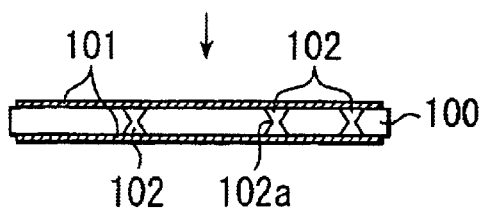

At first, as shown in FIG. 1A, a laminate 100 having conductive films 101 comprising copper foils on both side of an insulating board is prepared. As shown in FIG. 1B, for example, via holes 102 that are conductive holes are formed from both sides of the laminate 100. Each via hole 102 is formed so as to be wider at the surface side of the laminate 100 than at the middle 102a of the via hole 102. Because the area that is available for electrical connection to the via hole 102 is wide, it is easy to fill up the conduction hole and planarize the surface.

Exemplary methods for forming a through hole 102 include a method in which a drill is used for drilling, a method in which a punch having a sharp tip is used with tapping, and a method in which a laser beam is converged. At that time, by forming a via hole 102 by means of carbon dioxide gas laser after a copper foil on the one side of the laminate 100 has been removed previously by means of etching or the like, a conical via hole 102 having copper foil on the other side is formed.

Figure 1C:
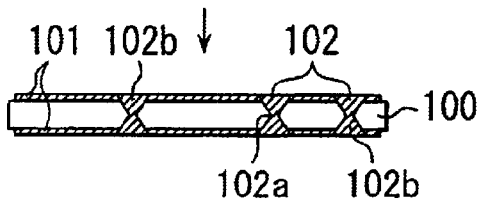

Next, as shown in FIG. 1C, a sufficient plated metal layer 102b is formed on the inside of the via hole by means of low current plating or pulse plating on the laminate 100. Thereby, the laminate 100 becomes conductive between both sides. At that time, if metal plated layer 102b is formed so as to fill the via hole 102, a process for filling up the via hole 102 can be eliminated.

Figure 1D:
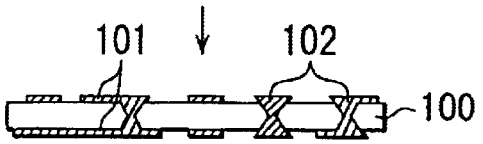

Then, as shown in FIG. 1D, both sides of the laminate 100 are polished and planarized, and a desired pattern is formed on the conductive film 101 by means of photolithography technique.

Figure 1E:
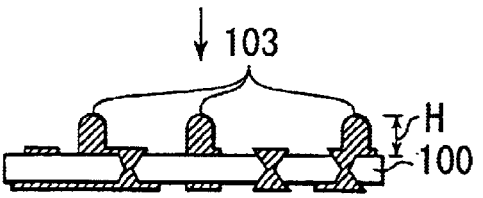

Thereafter as shown in FIG. 1E, projection members 103 consisting of metal are formed on the desired location on the laminate 100. The height H of the projection member 103 is adjusted desirably because metal is used for forming the projection member 103 differently from the case in which conductive paste is used for forming the projection member 103. In the case of metal, it is not required to widen the projection member 103 horizontally in spite of thick interlayer, and thus the high density wiring is realized. Furthermore, because the projection member 103 consists of metal, the resistance value of the projection member 103 is reduced.

Figure 1F:
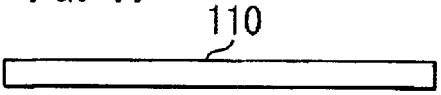
Figure 1G:
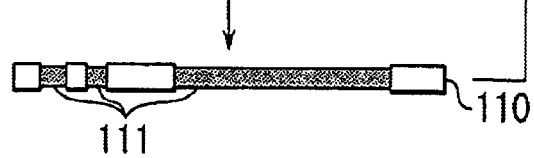

On the other hand, a prepreg 110 that is to be used as a binding member as shown in FIG. 1F is prepared separately from the laminate 100, and through holes 111 are formed at the desired position of the prepreg 110 as shown in FIG. 1G. The prepreg 110 is a material formed by partially hardening epoxy resin or the like impregnated in glass cloth.

Figure 1H:
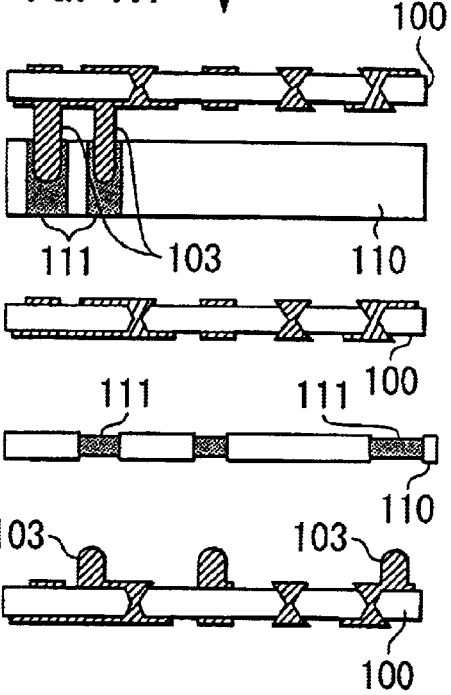
Figure 1I:
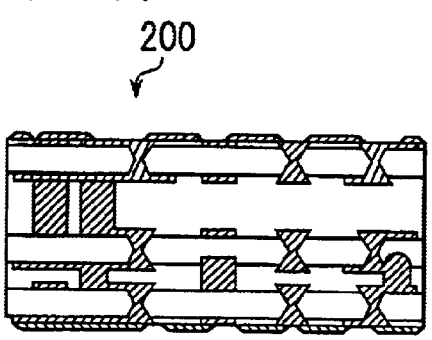

Subsequently, as shown in FIG. 1H, laminates 100 and prepregs 110 are laminated alternately with insertion of projection members 103 into through holes 111. Then, the laminated laminates 100 and prepregs 110 are press-molded with heating to manufacture a multilayer printed wiring board 200. At that time, electrical connection between the projection members 103 and conductive films 101 is secured by coating of conductive paste, by forming plated gold layer, or by coating of reducing agent such as formalin or glyoxylic acid on the top end of the projection members 103 or portion of the conductive films 101 to be connected to the projection members 103. Thereby the conductive films 101 are rendered surely conductive to the projection members 103. Finally, as shown in FIG. 1I, solder resist is coated and apparent finishing work is applied, and thus a multilayer printed wiring board 200 is completed. Subsequently, the multilayer printed wiring board 200 is subjected to inspection.

According to the present embodiment, electrical connection between laminates 100 can be secured in one forming process when a multilayer printed wiring plate 200 is manufactured. Thereby, the manufacturing process can be simplified and the manufacturing time can be shortened. Furthermore, because electrical connection can be formed at arbitrary portions on the laminates 100, the freedom of wiring is improved and high density wiring is realized. Furthermore, because a multilayer printed wiring board 200 is formed not by laminating insulating layers one on another differently from the conventional method, as the result the yield can be improved. In detail, when a multilayer printed wiring board 200 is manufactured by means of a lamination method, the yield is represented by the product of the number of layers. On the other hand, according to the method for manufacturing a multilayer printed wiring board 100 shown in FIG. 1A to FIG. 1I, because each laminate 100 is inspected individually and only the non-defective laminate is used for lamination, as the result the yield is improved. Furthermore, because a projection member 103 is surrounded by only resin that has migrated from a prepreg 110, as a result the migration that is caused by migration of metal ions along glass cloth is suppressed.

Figure 2A:
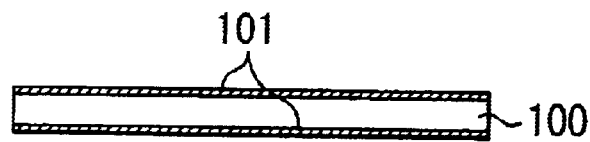
FIG. 2A to FIG. 2E are schematic process diagrams for illustrating a preferred embodiment of a method for manufacturing a multilayer printed wiring board of the present invention.
Figure 2B:
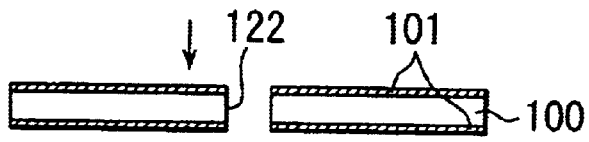

FIG. 2A to FIG. 2E are process diagrams for illustrating another embodiment of a method for manufacturing a laminate 100 having both sides that are electrically connected to each other in the method for manufacturing a multilayer printed wiring board shown in FIG. 1A to FIG. 1I. At first, a laminate 100 comprising an insulating board having conductive films 101 on both sides as shown in FIG. 2A is prepared, and a cylindrical via hole 122 is formed by, for example, drilling as shown in FIG. 2B.

Figure 2C:
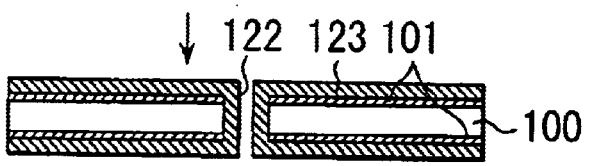
Figure 2D:
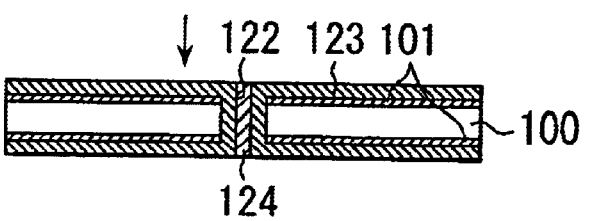
Figure 2E:
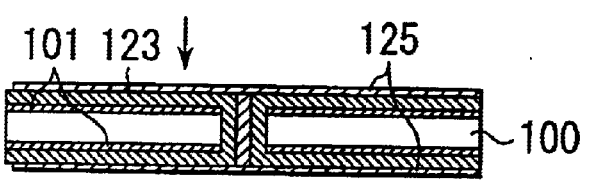

Next, as shown in FIG. 2C, for example, copper sulfate plated layer 123 is formed on the surface of the via hole 122 and the conductive films 101. Subsequently, as shown in FIG. 2D, for example, UV ink or conductive paste layer 124 is filled in the via hole 122. Then, plated layers 125 are formed on both sides, particularly in the case that the portion on the via hole 122 is rendered conductive, and the plated layer 125 is formed also on the portion on the via hole 122 and planarized by polishing. As described hereinabove, a laminate 100 having both sides that are conductive to each other may be formed by means of the method in which a cylindrical via hole 122 is formed for conduction between the both sides and conductive paste is filled in the via hole 122.

Figure 3A:
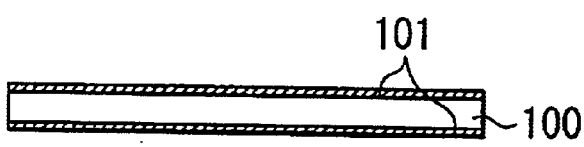
FIG. 3A to FIG. 3C are process diagrams for illustrating the second embodiment of a method for manufacturing a laminate having both sides that are conductive each other in the method for manufacturing a multilayer printed wiring board of the present invention.
Figure 3B:
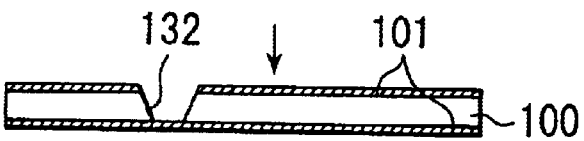
Figure 3C:
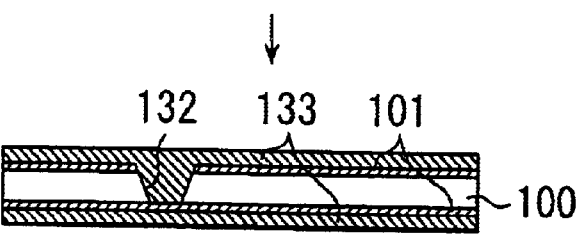

FIG. 3A to FIG. 3C are process diagrams for illustrating the third embodiment of the multilayer printed wiring board of the present invention, and a method for manufacturing a multilayer printed wiring board will be described with reference to FIG. 3A to FIG. 3C.

At first, in FIG. 3A, a laminate 100 comprising an insulating board having both sides on which conductive films 101 consisting of copper, aluminum or the like are formed is prepared. Subsequently, as shown in FIG. 3B, a conical via hole 132 is formed by, for example, laser convergence. At that time, the via hole 132 is formed from the one surface side.

Subsequently, as shown in FIG. 3C, the conductive films 101 are subjected to plating, and the via hole 132 is filled up with conductive material. At that time, for example, a current density of 1 ($a/dm^3$) or lower is preferably applied in an electrolytic plating process or a PR electrolytic plating process so that the via hole 132 is easily filled up with the plated layer 133. Then, the surface of the plated layer 133 is polished to complete the planar laminate 100.

FIG. 4A to FIG. 4E are process diagrams for illustrating a method for forming a projection member in the method for manufacturing a multilayer printed wiring board of the present invention, and the method for forming a projection member will be described with reference to FIG. 4A to FIG. 4E.

Figure 4A:
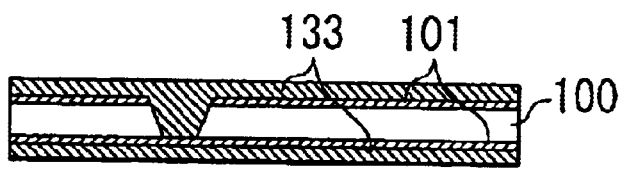
FIG. 4A to FIG. 4E are process diagrams for illustrating the third embodiment of a method for manufacturing a laminate having both sides that are conductive each other in the method for manufacturing a multilayer printed wiring board of the present invention.
Figure 4B:
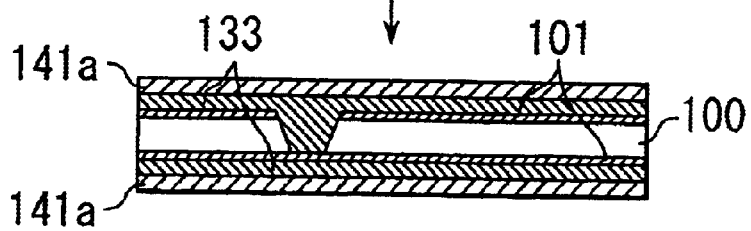

At first, as shown in FIG. 4A, films consisting of an etching-selective metal such as tin are formed by plating on the planar surface of a laminate 100 having both sides that are connected electrically to each other as shown in FIG. 4B. Furthermore, projection forming films 141a comprising copper foil having a thickness equivalent to that of the projection member 141 is formed by plating on the films.

Figure 4C:
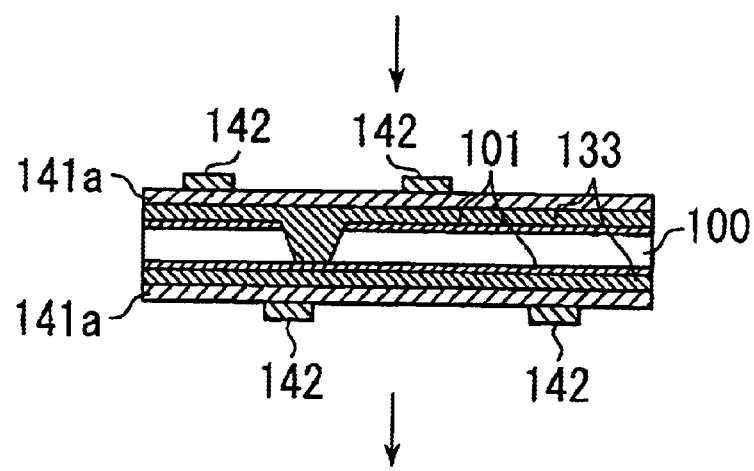

Then, as shown in FIG. 4C, etching resists 142 are formed on the portions of the projection forming films 143a where projection members 143 are to be formed. The projection forming films 143a and the films are etched with, for example, ammonium alkali etchant.

Figure 4D:
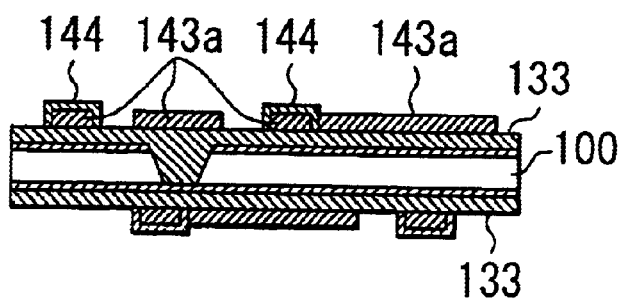
Figure 4E:
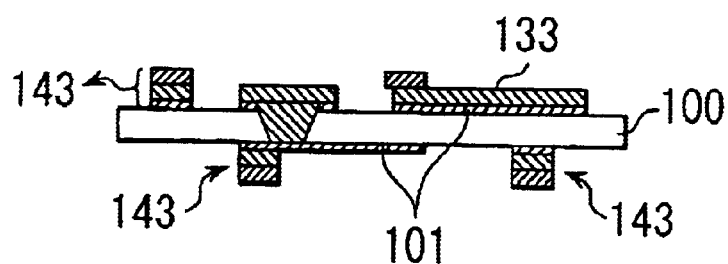

Subsequently, as shown in FIG. 4D, to pattern electrode films 101 and plated layers 133 desiredly, positive type electrodeposition resist layer 144 is coated on both sides of the laminate 100, and the resist layer is patterned in the desired pattern by means of a projection type parallel exposing apparatus. Then, the laminate 100 is etched with cupric chloride to remove the resist, and thus the laminate 100 having projection members 143 is completed.

FIG. 5A to FIG. 5E are process diagrams for illustrating another exemplary method for forming the projection member in the method for manufacturing a multilayer printed wiring board of the present invention.

Figure 5A:
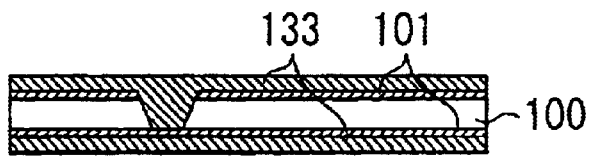
FIG. 5A to FIG. 5E are process diagrams for illustrating an embodiment of a method for forming a projection member in the method for manufacturing a multilayer printed wiring board of the present invention.
Figure 5B:
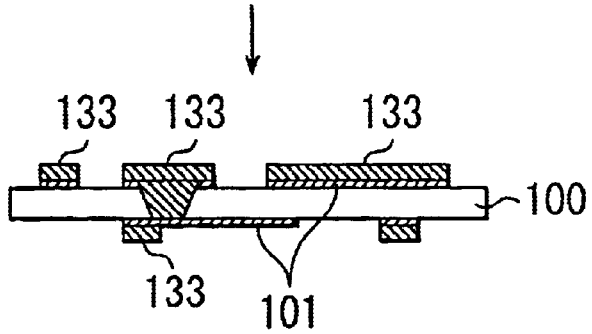

At first, as shown in FIG. 5A, a planar laminate 100 having conductive films 101 on both sides that are connected electrically to each other is prepared, and pattern resist layer is formed on plated layers 133 as shown in FIG. 5B.

Subsequently, the conductive films 101 and plated layers 133 are etched to form a desired pattern.

Figure 5C:
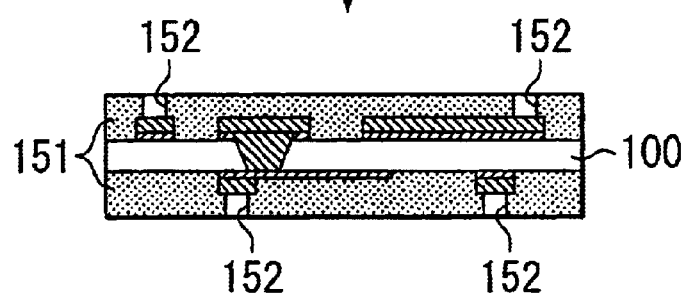
Figure 5D:
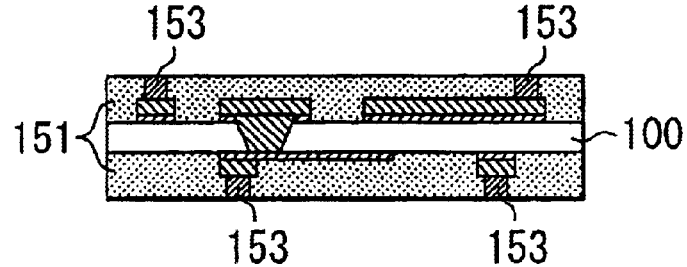
Figure 5E:
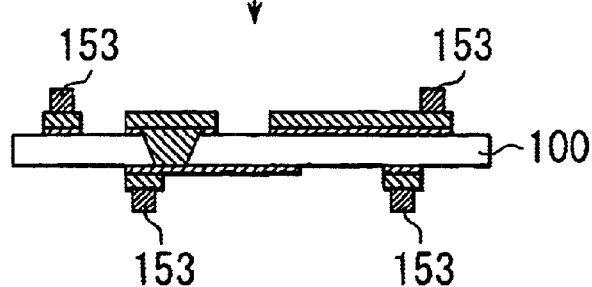

Next, as shown in FIG. 5C, resist layer 151 is formed on the entire surface (both sides) of the laminate 100, and openings 152 are formed on portions of the resist layer 151 where projection members 153 are to be formed. Then, as shown in FIG. 5D, catalyst is applied on the entire surface and electric plating is applied to form the projection members 153. Otherwise, the surface of copper is replaced with palladium, and the projection members 153 are formed by means of electroless plating. Subsequently, as shown in FIG. 5E, the resist layer 151 is removed to complete the laminate 100 having projection members 153.

Figure 6A:
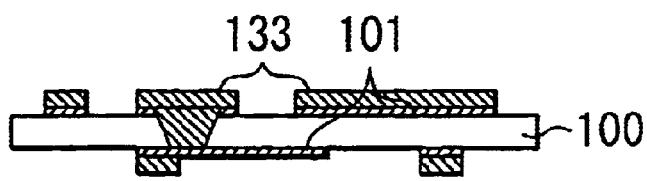
FIG. 6A and FIG. 6B are process diagrams for illustrating the second embodiment of a method for forming a projection member in the method for manufacturing a multilayer printed wiring board of the present invention.
Figure 6B:
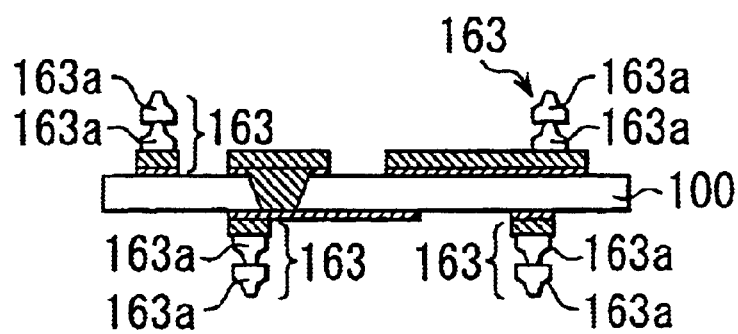

FIG. 6A and FIG. 6B are process diagrams for illustrating another exemplary method for forming the projection member in the method for manufacturing a multilayer printed wiring board of the present invention, and the method for forming the projection member will be described with reference to FIG. 6A and FIG. 6B.

At first, a planar laminate 100 having conductive films 101 on both sides that are connected electrically each other is formed as shown in FIG. 6A. Then, pattern resist is coated on plated layers 133, and the conductive films 101 and the plated layers 133 are etched to form a desired pattern.

Subsequently, as shown in FIG. 6B, bumps 163a are disposed on portions where the projection members 163 on the plated layers 133 are to be formed by stud bump bonder. A plurality of bumps 163a are stacked so that the projection members 163 are positioned at a desired height. By repeating the above-mentioned process, the projection members 163 are formed.

Figure 7A:
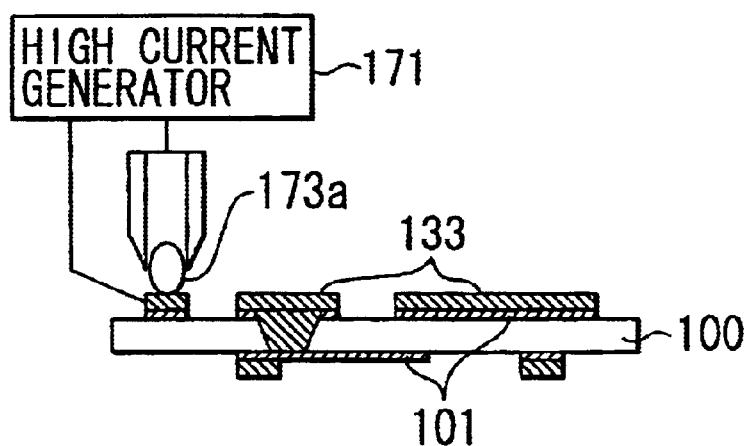
FIG. 7A and FIG. 7B are process diagrams for illustrating the third embodiment of a method for forming a projection member in the method for manufacturing a multilayer printed wiring board of the present invention.
Figure 7B:
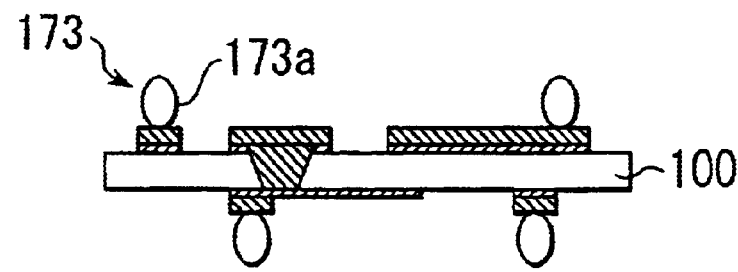
Figure 8A:
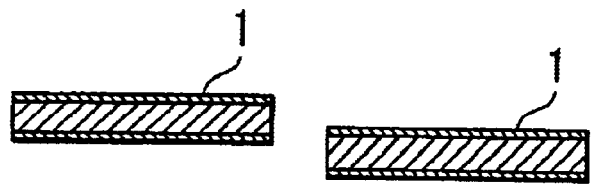
FIG. 8A to FIG. 8E are process diagrams for illustrating an exemplary conventional method for manufacturing a multilayer printed wiring board.
Figure 8B:
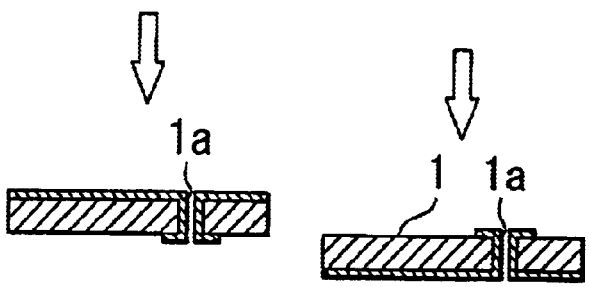
Figure 8C:
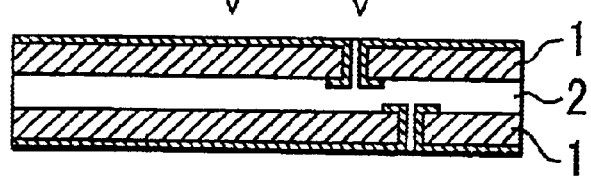
Figure 8D:
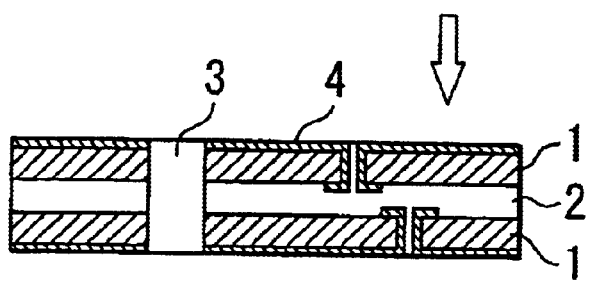
Figure 8E:
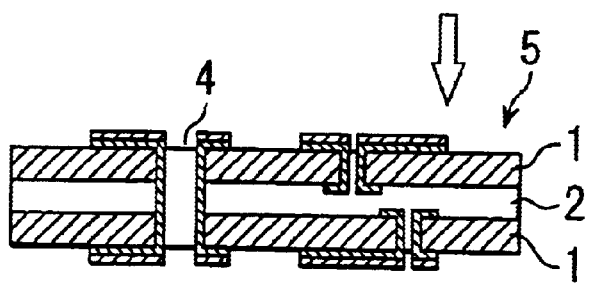

FIG. 7A and FIG. 7B are process diagrams for illustrating another exemplary method for forming the projection member in the method for manufacturing a multilayer printed wiring board of the present invention.

At first, a planar laminate 100 having conductive films 101 on both sides that are connected electrically to each other as shown in FIG. 7A is formed. Then, pattern resist is coated on plated layers 133, and the conductive films 101 and plated layers 133 are etched to form a desired pattern.

Subsequently, as shown in FIG. 6B, metal wires 173a are disposed on portions where projection members 173 are to be formed on the conductive films 101. A high current is applied between a metal wire 173a and a conductive film 102 (plated layer 133) by means of a high current generator 171. At that time, the metal wire 173a melts to form a projection member 173.

The embodiment of the present invention is by no means limited by the above-mentioned embodiments. For example, when printed wiring boards and prepregs are laminated, printed wiring boards on which parts such as IC are mounted and prepregs on which recesses are formed are laminated to manufacture a parts-built-in board easily.

In the methods for manufacturing the projection member shown in FIGS. 4A to 4E to FIGS. 7A and 7B, a planar laminate 100 having both sides that are electrically connected to each other shown in FIG. 3A to FIG. 3C is used for the purpose of description, a laminate 100 manufactured by mans of the methods shown in FIG. 1A to FIG. 1I and FIG. 2A to FIG. 2E may be used.

As described hereinabove, according to the present invention, when a multilayer printed wiring board is manufactured, electrical connection between laminates is formed in one forming process to thereby realize simplified manufacturing process and shortened manufacturing time, and electrical connection is formed at arbitrary portions on respective laminates to thereby realize improved freedom of wiring and high density wiring.

What is claimed is:

1. A method for manufacturing a multilayer printed wiring board formed by laminating a plurality of laminates comprising:

forming a laminate by forming conductive films on both sides of an insulative substrate;

forming a plurality of conduction holes on said laminate;

forming a conductive layer on the inner peripheral surface of said conduction hole to thereby render said laminate conductive between both sides thereof and to thereby fill said conduction hole;

planarizing the surface of said laminate;

patterning said conductive film;

forming a plurality of projection members on predetermined positions on said conductive film;

forming a plurality of bonding members having a plurality of through holes; and laminating said laminates and said bonding members alternately with inserting said projection members into said through holes and for heat-press molding the laminated layers;

wherein said laminate is electrically connected by means of a process in which conductive paste is coated between said projection member to be bonded and said conductive film, and said laminate and said bonding member that have been laminated are subjected to press-heating; and wherein said laminate is electrically connected by means of a process in which conductive plated layers are formed on the surface of said projection member to be bonded and the surface of said conductive film, and said laminate and said bonding member that have been laminated are subjected to press-heating.

2. A method for manufacturing a multilayer printed wiring board as claimed in claim 1, wherein said conduction hole is formed from only one side of said laminate so as to be approximately conical shape having wide end at one side.

3. A method for manufacturing a multilayer printed wiring board as claimed in claim 1, wherein said conduction hole is formed from both sides of said laminate so as to have openings of said conduction hole larger than that at the middle of said conduction hole.

4. A method for manufacturing a multilayer printed wiring board as claimed in claim 2 or claim 3, wherein said conduction hole is a conical hole formed by converging the laser beam.

5. A method for manufacturing a multilayer printed wiring board as claimed in claim 1, wherein said conductive layer is a plated metal layer.

6. A Method for manufacturing a multilayer printed wiring board formed by laminating a plurality of laminates comprising:

forming a laminate by forming conductive films on both sides of an insulative substrate;

forming a plurality of approximately cylindrical conduction holes on said laminate;

forming a conductive layer on the inner peripheral surface of said conduction hole and on said conductive film to thereby render said laminate conductive between both sides thereof;

filling said conduction hole with a filling layer;

planarizing the surface of said laminate;

patterning said conductive film and said conductive layer desirably;

forming a plurality of projection members on predetermined positions on said conductive film;

forming a plurality of bonding members having a plurality of through holes; and laminating said laminates and said bonding members alternately with inserting said projection members into said through holes and for heat-press molding the laminated layers;

wherein said laminate is electrically connected by means of a process in which conductive paste is coated between said projection member to be bonded and said conductive film, and said laminate and said bonding member that have been laminated are subjected to press-heating; and wherein said laminate is electrically connected by means of a process in which conductive plated layers are formed on the surface of said projection member to be bonded and the surface of said conductive film, and said laminate and said bonding member that have been laminated are subjected to press-heating.

7. A method for manufacturing a multilayer printed wiring board as claimed in claim 6, wherein said conductive layer is a plated metal layer.

8. A method for manufacturing a multilayer printed wiring board as claimed in claim 6, wherein said filling layer is a UV ink layer or conductive paste layer.

9. A method for manufacturing a multilayer printed wiring board as claimed in claim 6, wherein said bonding member is a prepreg.

10. A method for manufacturing a multilayer printed wiring board as claimed in claim 1 or claim 6, wherein said projection member is formed by means of a process in which a conductive projection forming film having a height equivalent to the height of the projection member is formed on said conductive film, resist is coated on the portion where said projection member is to be formed on said projection forming film, and said projection forming film is etched.

11. A method for manufacturing a multilayer printed wiring board as claimed in claim 1 or claim 6, wherein said projection member is formed by means of a process in which resist is coated on the entire surface of said laminate, an opening is formed on the portion of the resist layer where said projection member is to be formed, and said opening is filled with conductive material.

12. A method for manufacturing a multilayer printed wiring board as claimed in claim 1 or claim 6, wherein said projection member is formed by means of a process in which a bump consisting of conductive material is provided on the portion of said conductive film where said projection member is to be formed.

13. A method for manufacturing a multilayer printed wiring board as claimed in claim 1 or claim 6, wherein said projection member is formed by means of a process in which a metal wire is provided on the portion of said conductive film where said projection member is to be formed.

* * * * *